US008878344B2

(12) United States Patent
Parthasarathy et al.

(10) Patent No.: US 8,878,344 B2
(45) Date of Patent: Nov. 4, 2014

(54) COMPOUND SEMICONDUCTOR LATERAL PNP BIPOLAR TRANSISTORS

(71) Applicant: Analog Devices, Inc., Norwood, MA (US)

(72) Inventors: Srivatsan Parthasarathy, Acton, MA (US); Javier Alejandro Salcedo, North Billerica, MA (US); Shuyun Zhang, Allston, MA (US)

(73) Assignee: Analog Devices, Inc., Norwood, MA (US)

( * ) Notice: Subject to any disclaimer, the term of this patent is extended or adjusted under 35 U.S.C. 154(b) by 22 days.

(21) Appl. No.: 13/655,026

(22) Filed: Oct. 18, 2012

(65) Prior Publication Data
US 2014/0110825 A1    Apr. 24, 2014

(51) Int. Cl.
H01L 29/66    (2006.01)

(52) U.S. Cl.
USPC ........................................................ 257/565

(58) Field of Classification Search
USPC ........... 257/47, 197, 205, 273, 351, 361, 362, 257/370, 373, 378, 423, 474, 477, 498, 511, 257/517, 525, 526, 539, 542, 555–557, 565, 257/575, E21.35, E21.351, E21.372, 257/E21.38, E21.382, E21.383, E21.608, 257/E21.695, E27.015–E27.063, E27.106, 257/E27/109, E27/149, E29.003, E29/033, 257/E29.034, E29.036, E29.037, E29.044, 257/E29.114, E29.124, E29.169, E29.171, 257/E29.174, E29.182, E29.194, E29.197, 257/E29.281, E51.004, E31/069; 438/170, 438/189, 202–205, 234–236, 309, 313, 322, 438/325, 327, 336, 340
See application file for complete search history.

(56) References Cited

U.S. PATENT DOCUMENTS

| 4,510,676 | A | 4/1985 | Anantha et al. .............. 29/577 C |
| 4,672,414 | A | 6/1987 | Gabriel et al. ................... 357/34 |
| 5,326,710 | A | 7/1994 | Joyce et al. ..................... 437/31 |
| 5,796,157 | A | 8/1998 | Fallico et al. .................. 257/557 |
| 6,551,869 | B1 | 4/2003 | Chai et al. ...................... 438/204 |
| 2002/0064906 | A1 | 5/2002 | Enquist .......................... 438/109 |
| 2011/0248375 | A1* | 10/2011 | Van den Oever ............. 257/474 |
| 2011/0250726 | A1* | 10/2011 | Murayama et al. ........... 438/235 |

OTHER PUBLICATIONS

Alexandre et al., "Quasi-planar GaAs heterojunction bipolar transistor device entirely grown by chemical beam epitaxy," Elsevier Science B.V., North-Holland, Journal of Crystal Growth 136 , pp. 235-240, 1994.
Chang, "A Manufacturable GaAs BiFET Technology for High Speed Signal Processing," IEEE, pp. 279-282,1995.
Chang, "Heterojunction BiFET Technology for High Speed Electronic Systems," IEEE, pp. 15-20, 1997.
Glew et al., Abstract: "*GaAlAs/GaAS p-n-p*heterojunction bipolar transistors grown by MOCVD," Journal of Crystal Growth, vol. 68, Issue 1, pp. 450-452, Sep. 1984.

(Continued)

Primary Examiner — Fernando L Toledo
Assistant Examiner — Lawrence-Linh T Nguyen
(74) Attorney, Agent, or Firm — Sunstein Kann Murphy & Timbers LLP

(57) ABSTRACT

Compound semiconductor lateral PNP bipolar transistors are fabricated based on processes traditionally used for formation of compound semiconductor NPN heterojunction bipolar transistors and hence such PNP bipolar transistors can be fabricated inexpensively using existing fabrication technologies. In particular, GaAs-based lateral PNP bipolar transistors are fabricated using GaAs-based NPN heterojunction bipolar transistor fabrication processes.

18 Claims, 8 Drawing Sheets

(56) References Cited

OTHER PUBLICATIONS

Gupta et al., "InGaP-*Plus*™—A major advance in GaAs HBT Technology," IEEE, pp. 179-182, 2006.

Hill, "P-N-P. heterojunction bipolar transistors in AlGaAs/InGaAs/GaAs," Stanford University, 160 pages, 1990.

Ho et al., "A GaAs BiFET LSI Technology, GaAs IC Symposium," IEEE, pp. 47-50, 1994.

Krautle et al., Lateral PNP GaAs Bipolar Transistor with Minimized Substrate Current, IEEE Electron Device Letters, vol. EDL-3, No. 10, pp. 315-317, Oct. 1982.

Krautle et al., Abstract: "Lateral *pnp* GaAs bipolar transistor prepared by ion implantation," The Institution of Electrical Engineers, Electronic Letters, vol. 18, Issue 6, pp. 259-260, Mar. 1982.

Lin et al., "The Monolithic Integration of InGaAs pHEMT and InGaP HBT Technology for Single-Chip WiMAX RF Front-End Module," IEEE, 4 pages, 2011.

Maneux et al., "Experimental procedure for the evaluation of GaAs-based HBT's reliability," Elsevier, Microelectronics Journal, vol. 32, pp. 357-371, 2001.

Matsumoto et al., Abstract: "pnp-Type GaAs Inversion-Base Bipolar Transistor (pnp-type GaAs IBT)," Japanese Journal of Applied Physics, vol. 28, pp. L538-L540, 1989.

Patkar et al., Abstract: "Transistor-based studies of heavy doping effects in *n*-GaAs," Applied Physics Letter, vol. 59, Issue 15, 2 pages, 1991.

Peatman et al., "InGaP-*Plus*™: Advanced GaAs BiFET Technology and Applications," CS MANTECH Conference, May 14-17, 2007, Austin, TX, pp. 243-246.

Streit et al., "Monolithic HEMT-HBT Integration for Novel Microwave Circuit Applications, GaAs IC Symposium," IEEE, pp. 329-332, 1994.

Streit et al., "Monolithic HEMT-HBT Integration by Selective MBE," IEEE Transactions on Electron Devices, vol. 42, No. 4, pp. 618-623, Apr. 1995.

Clauss, "Real structures of bipolar transistor," from website: http://virtual.cvut.cz/course/semicond/node41.html, 3 pages, Jan. 21, 2005.

Wikimedia Commons, File: Bipolar Junction Transistor PNP Structure integrated lateral.png, from website: http://commons.wikimedia.org/wiki/File:Bipolar_Junction_Transistor_PNP_Structure_integrated_lateral.png, page last modified Sep. 2, 2009.

* cited by examiner ical PNP BIPOLAR TRANSISTORS

FIELD OF THE INVENTION

The present invention relates generally to compound semiconductor lateral PNP bipolar transistors and methods for fabricating such transistors.

BACKGROUND OF THE INVENTION

It is known to produce gallium-arsenide (GaAs) based N-P-N heterojunction bipolar transistors (HBTs) using traditional semiconductor fabrication techniques. Examples of such transistors are shown and described in the following documents Streit et al., Monolithic HEMT-HBT Integration by Selective MBE, IEEE Transactions on Electron Devices, Vol. 42, No. 4, April 1995 (see, for example, FIG. 3);

Streit et al., Monolithic HEMT-HBT Integration for Novel Microwave Circuit Applications, GaAs IC Symposium, IEEE, 1994 (see, for example, FIG. 3);

Ho et al., A GaAs BiFET LSI Technology, GaAs IC Symposium, IEEE, 1994 (see, for example, FIG. 1);

Chang, M. F., A Manufacturable GaAs BiFET Technology for High Speed Signal Processing, IEEE, 1995 (see, for example, FIG. 1);

Chang, M. F., Heterojunction BiFET Technology for High Speed Electronic Systems, IEEE, 1997 (see, for example, FIG. 1);

Gupta et al., InGaP-Plus™—A major advance in GaAs HBT Technology, IEEE, 2006 (see, for example, FIG. 1);

Peatman et al., InGaP-Plus™: Advanced GaAs BiFET Technology and Applications, CA MANTECH Conference, May 14-17, 2007, Austin, Tex. (see, for example, FIG. 1);

Lin et al., The Monolithic Integration of InGaAs pHEMT and InGaP HBT Technology for Single-Chip WiMAX RF Front-End Module, IEEE, 2011 (see, for example, FIG. 1); and Alexandre et al., Quasi-planar GaAs heterojunction bipolar transistor device entirely grown by chemical beam epitaxy, Elsevier Science B.V., North-Holland, Journal of Crystal Growth 136 (1994) 235-240 (see, for example, FIG. 1).

U.S. Pat. No. 4,672,414 and U.S. Patent Application Publication No. US 2002/0064906 also may be relevant.

SUMMARY OF EXEMPLARY EMBODIMENTS

In certain embodiments, a compound semiconductor lateral PNP bipolar transistor comprises a doped P-type planar compound semiconductor layer including a compound semiconductor-based emitter and a compound semiconductor-based collector arranged at the same level and laterally with respect to one another, wherein the emitter and the collector are separate and electrically insulated from one another; a doped N-type planar compound semiconductor layer underlying the doped P-type planar compound semiconductor layer and including a compound semiconductor-based base element electrically coupled to the separate emitter and collector; at least one metallic base structure connection electrically coupled to the base element and electrically insulated from the emitter and the collector; first and second metallic electrodes at a first level above the doped P-type planar compound semiconductor layer and electrically connected independently to the emitter and collector, respectively; and at least one base electrode formed at a second level above the doped N-type planar compound semiconductor layer and connected to the at least one metallic base structure connection, wherein the second level is below the first level.

In certain other embodiment, a compound semiconductor lateral PNP bipolar transistor comprises a doped P-type compound semiconductor emitter and a doped P-type compound semiconductor collector arranged laterally with respect to one another and electrically insulated from one another; a doped N-type compound semiconductor base element underlying and electrically coupled to the separate emitter and collector; and at least one metallic base structure connection electrically coupled to the base and electrically insulated from the emitter and the collector.

In certain other embodiments, a method for fabricating a compound semiconductor lateral PNP bipolar transistor involves fabricating a doped P-type compound semiconductor-based emitter and a doped P-type compound semiconductor-based collector arranged laterally with respect to one another and electrically insulated from one another; fabricating a doped N-type compound semiconductor-based base element underlying and electrically coupled to the separate emitter and collector; fabricating at least one metallic base structure connection electrically coupled to the base element and electrically insulated from the emitter and the collector; fabricating first and second metallic electrodes at a first level above the emitter and collector layer and electrically connected independently to the emitter and collector, respectively; and fabricating at least one base electrode at a second level above the base element layer and connected to the at least one metallic base structure connection, wherein the second level is below the first level.

In various alternative embodiments of the above, the compound semiconductor layers may be GaAs-based compound semiconductor layers. The at least one metallic base structure connection may include a plurality of metallic base structure connections. The emitter and the collector may be between the plurality of metallic base structure connections. The emitter and the collector may be formed from GaAs doped with carbon to a concentration between approximately 2E19-4E19. The base element may be formed from GaAs doped with silicon to a concentration between approximately 1E18-1E19. The first and second metallic electrodes may be separated laterally from one another by a distance of approximately 1 µm to 5 µm. The emitter and the collector may be separated laterally from one another by a distance of approximately 1 µm to 5 µm. The emitter may have a width of approximately 2 µm to 12 µm. The collector may have a width of approximately 2 µm to 12 µm. Each base electrode may be separated laterally from an adjacent emitter or collector by a distance of approximately 1 µm to 5 µm.

Additional embodiments may be disclosed and claimed.

BRIEF DESCRIPTION OF THE DRAWINGS

The foregoing features of embodiments will be more readily understood by reference to the following detailed description, taken with reference to the accompanying drawings, in which.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

As discussed above, fabrication of high-performance NPN heterojunction bipolar transistor (HBT) devices is known. In embodiments of the present invention, low-cost PNP devices are fabricated using compound NPN fabrication flows for enabling specialized current reference and other circuit blocks used in compound semiconductor circuit applications, and in particular, compound semiconductor lateral PNP bipolar transistors are fabricated using such fabrication processes, which allows such PNP bipolar transistors to be fabricated inexpensively using existing fabrication technologies. For purposes of this description and the accompanying claims, unless the context otherwise requires, the term "compound semiconductor" refers to a semiconductor compound containing elements from two or more different groups of the periodic table. In certain specific exemplary embodiments described herein, the compound semiconductor lateral PNP bipolar transistors are based on a gallium arsenide (GaAs) compound semiconductor material, although various alternative embodiments may utilize other types of compound semiconductors to form similar compound semiconductor lateral PNP bipolar transistors using fabrication processes similar to those described herein.

Figure 1:
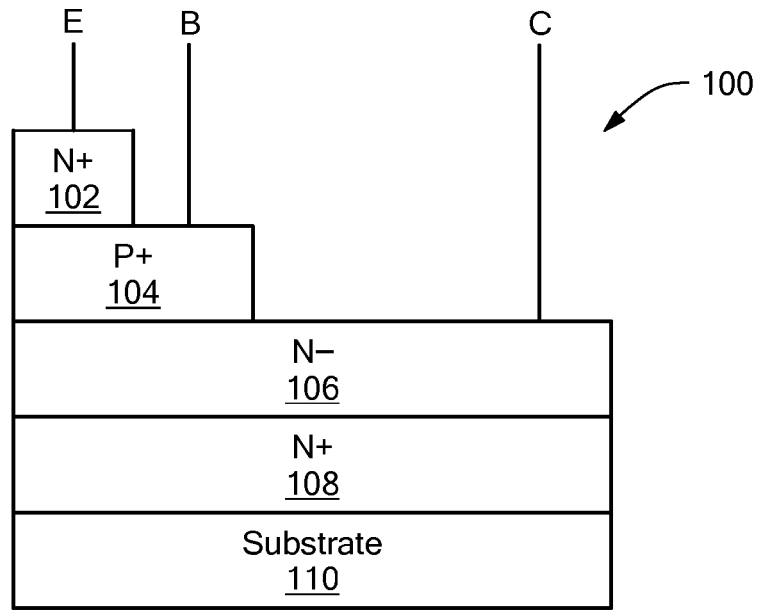
FIG. 1 is a schematic and conceptual diagram of an exemplary GaAs-based NPN heterojunction bipolar transistor 100 of the type known in the art.

FIG. 1 is a schematic and conceptual diagram of an exemplary GaAs-based compound semiconductor NPN heterojunction bipolar transistor 100 of the type known in the art. The transistor 100 is fabricated from layers of material and includes an emitter layer 102 which is generally an N+ doped GaAs material layer, a base layer 104 which is generally a P+ doped GaAs material layer, a collector layer 106 which is generally an N-doped GaAs material layer, a sub-collector layer 108 which is generally a N+ doped GaAs material layer, and a substrate layer 110 that may be a substantially intrinsic GaAs material layer. In the transistor 100, metallic connections are made to the emitter, base, and collector layers from the top of the device, as represented by the lines labeled E, B, and C, respectively. These structures and other structures that, for convenience, are not shown (e.g., insulating materials placed between various structures) are formed using various processes that may include deposition processes, patterning processes, etching processes, and other semiconductor and/or MEMS fabrication processes.

Figure 2:
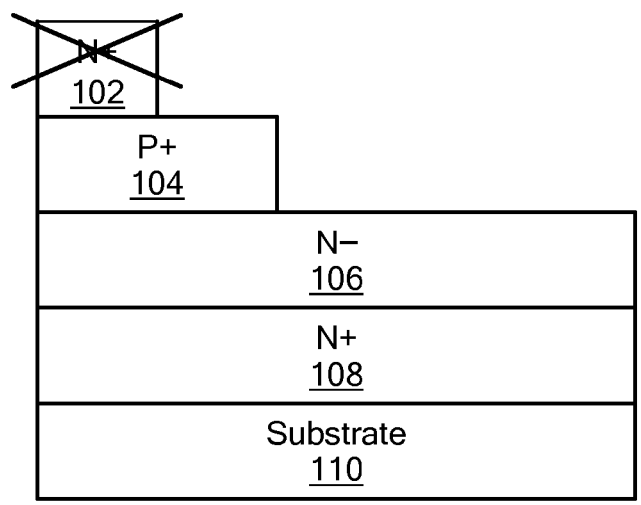
FIG. 2 schematically and conceptually depicts the omission of the N emitter layer as part of a fabrication process used to produce GaAs-based lateral PNP bipolar transistors based on a compound NPN fabrication flow, in accordance with one exemplary embodiment of the present invention.

In order to produce GaAs-based compound semiconductor PNP bipolar transistors, a variation on the fabrication process used to produce GaAs-based compound semiconductor NPN heterojunction bipolar transistors is used. In essence, the process omits fabrication of the N emitter layer 102, as depicted schematically and conceptually in FIG. 2. Furthermore, the process fabricates two P structures laterally at layer 104, with one used as the P emitter and the other used as the P collector. The N layer 106 is used as the base layer. The resulting structure is shown schematically and conceptually in FIG. 3, in which the PNP transistor 300 includes the P+ layer 304 from which the emitter 302 and collector 303 are fabricated (with an insulating material 301 such as silicon nitride between the emitter 302 and the collector 303), the N+ layer 306 which acts as the transistor base, the N− layer 308, and the substrate 310.

Figure 3:
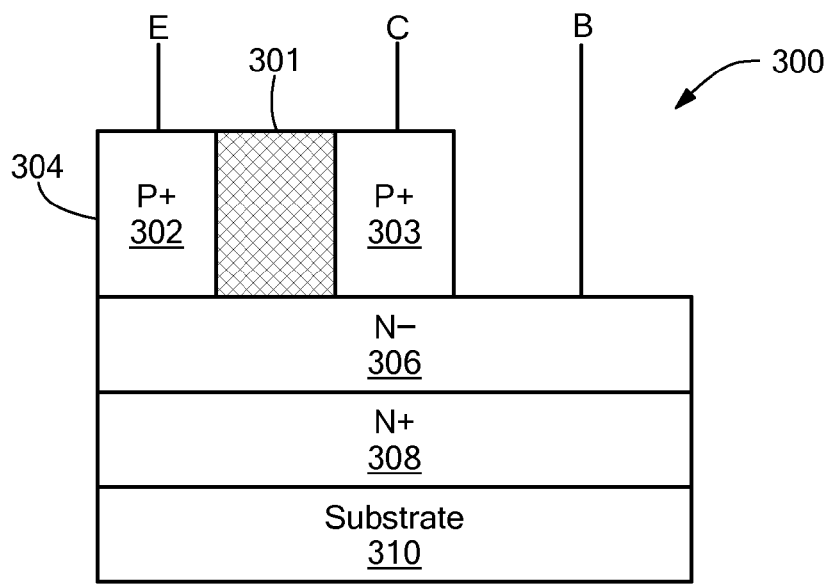
FIG. 3 schematically and conceptually depicts a variation of the fabrication process in which a P emitter and P collector are formed laterally at the P layer for the GaAs-based lateral PNP bipolar transistor, in accordance with one exemplary embodiment.

As opposed to the NPN transistor shown in FIG. 1, which is a vertical structure in which the collector is at the bottom of the NPN stack and the emitter is at the top of the NPN stack with the base sandwiched between the emitter and the collector, the PNP transistor shown in FIG. 3 is a lateral structure in which the emitter and collector are at the top of the PNP stack, with lateral control via the underlying N base layer.

Among other things, such a lateral structure facilitates fabrication of the device including simplification of the formation of the emitter and collector and the electrical connections to the emitter and collector. Compared to fabrication of the NPN transistor, fabrication of the PNP transistor generally would involve roughly the same number of process steps and perhaps fewer process steps, thereby maintaining or even reducing the cost to produce the transistor.

Figure 4:
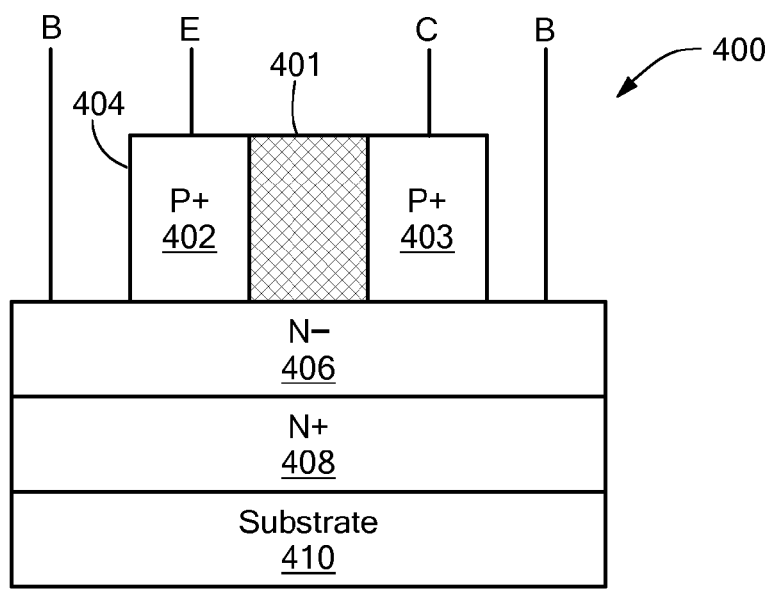
FIG. 4 schematically and conceptually depicts a GaAs-based lateral PNP bipolar transistor having two base structure connections with the emitter and the collector between the base structure connections, in accordance with one alternative embodiment of the present invention.

Additionally, such a lateral structure facilitates fabrication of a larger base structure with multiple base structure connections. Because the gain of the PNP device is related to the effective width of the base, the addition of a second base structure connection (or more than two base structure connections) with the emitter and the collector between the base structure connections is expected to allow for better control of the device while reducing the bandwidth of the device. An exemplary PNP transistor having two base structure connections is depicted schematically and conceptually in FIG. 4. The PNP transistor 400 includes the P+ layer 404 from which the emitter 402 and collector 403 are fabricated (with an insulating material 401 such as silicon nitride between the emitter 402 and the collector 403), the N+ layer 406 which acts as the transistor base, the N− layer 408, and the substrate 410.

Figure 5:
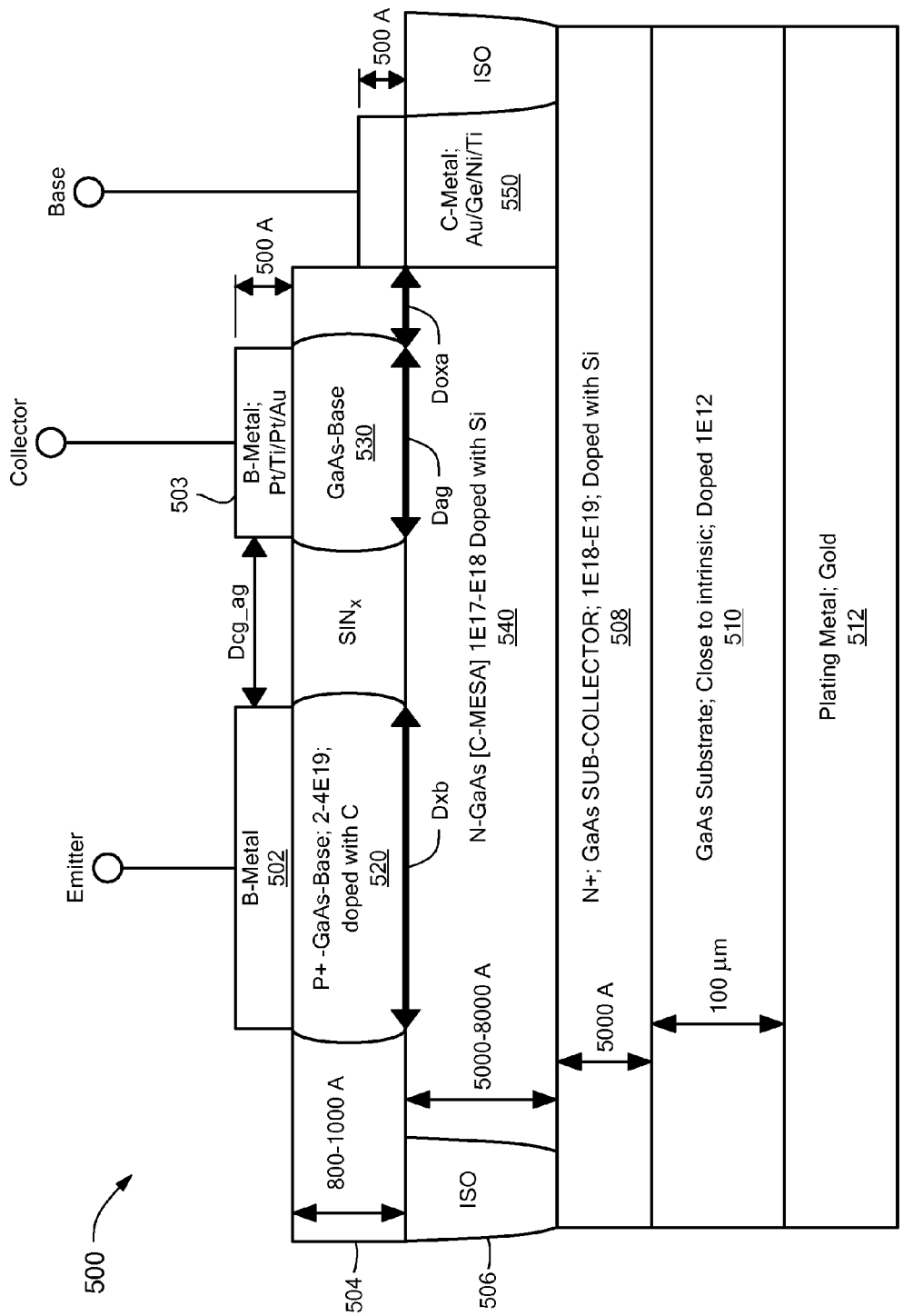
FIG. 5 is a schematic cross-sectional view of a GaAs-based PNP bipolar transistor of the type discussed above with reference to FIG. 3, in accordance with a first exemplary embodiment of the present invention.

FIG. 5 is a schematic cross-sectional view of a GaAs-based PNP bipolar transistor of the type discussed above with reference to FIG. 3, in accordance with a first exemplary embodiment of the present invention. The transistor 500 includes a layer 504 including the P+ emitter 520 and the P+ collector 530, which are separated by and surrounded by an insulating material such as a silicon nitride material (SiNx). In this exemplary embodiment, the layer 504 is approximately 800-1000 Å thick, and the P+ elements 520 and 530 are formed from a GaAs base that is doped with carbon to a concentration of approximately 2E19-4E19. Underlying the layer 504 is the layer 506, which includes the N− base 540

(referred to as the C-Mesa) and the base structure connection 550. In this exemplary embodiment, the layer 506 is approximately 5000-8000 Å thick, and the base 540 is formed from a GaAs base that is doped with silicon to a concentration between approximately 1E17-1E18. The base structure connection 550 is a metal structure (referred to as the C-Metal), e.g., formed from gold, germanium, nickel, or titanium. The base structure connection 550 extends above the layer 506 by approximately 500 Å and is electrically insulated from the emitter 520 and collector 530. Underlying the layer 506 is the layer 508, which in this exemplary embodiment is an N+ material approximately 5000 Å thick and formed from a GaAs base that is doped with silicon to a concentration between 1E18-1E19. Underlying the layer 508 is the substrate layer 510, which in this exemplary embodiment is approximately 100 µm thick and is formed from a GaAs based that is close to intrinsic (e.g., doped to a concentration of approximately 1E12). A plating metal (e.g., gold) layer 512 may underlie the substrate layer 510. Metal connectors 502 and 503 (referred to as the B-Metal) are formed on the emitter 520 and the collector 530, respectively, for the electrical connections to those elements, e.g., formed from gold, platinum, or titanium. In the exemplary embodiment shown in FIG. 5, the spacing between metal connectors 502 and 503 and similarly the spacing between the emitter 520 and the collector 530 (referred to in the drawing as dimension "Dcg_ag") are in the range of approximately 1 µm to 5 µm, for instance, around 1.5 µm; the width of emitter 520 (referred to in the drawing as dimension "Dxb") is in the range of approximately 2 µm to 12 µm, for instance, around 2.5 µm; the width of collector 530 (referred to in the drawing as dimension "Dag") is in the range of approximately 2 µm to 12 µm, for instance, around 2.5 µm; and the collector 530 is separated from the base structure connection 550 by insulating material having a width (referred to in the drawing as dimension "Doxa") in the range of approximately 1 µm to 5 µm, for instance, around 1.5 µm. Alternative embodiments may utilize different dimensions.

Figure 6:
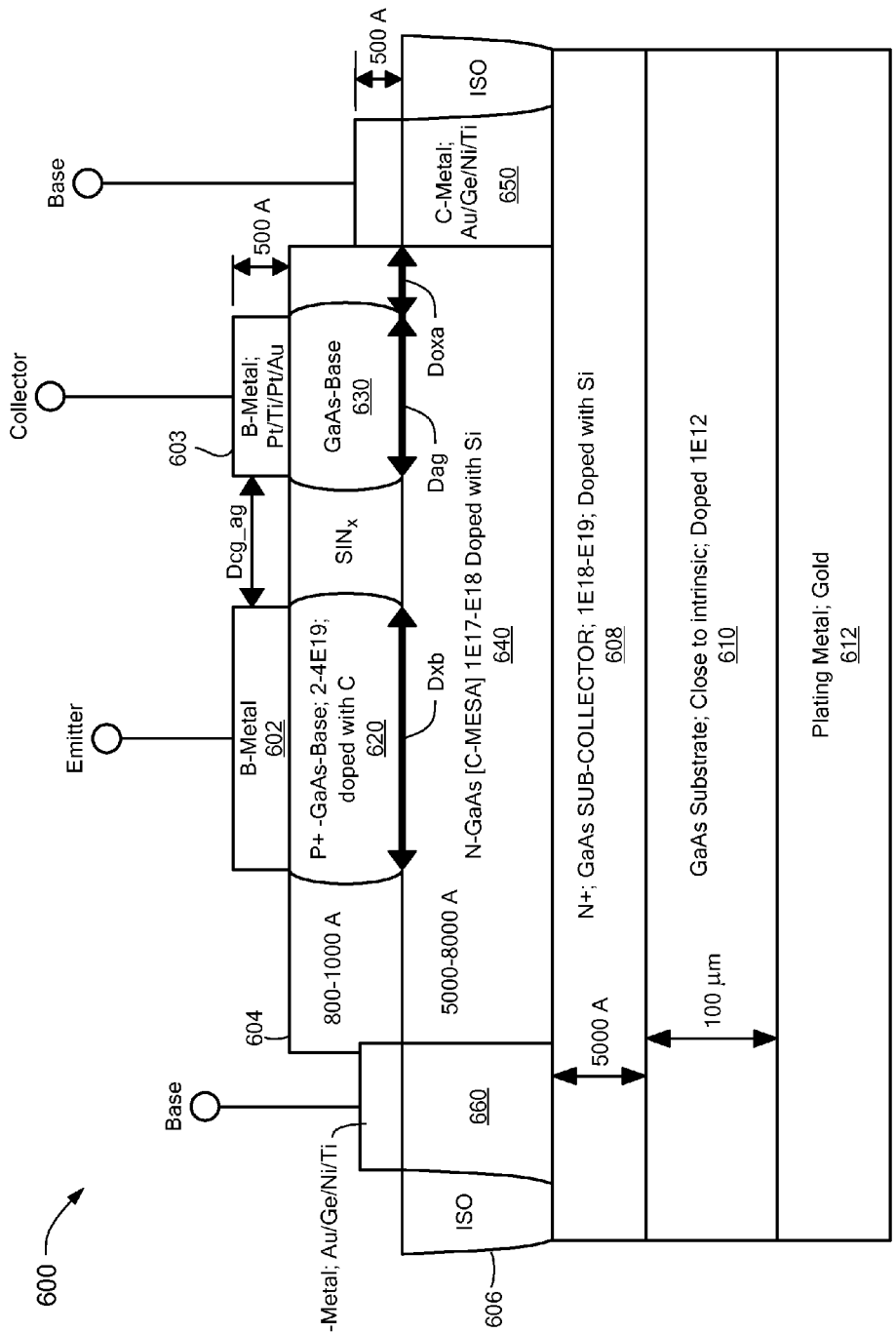
FIG. 6 is a schematic cross-sectional view of a GaAs-based PNP bipolar transistor of the type discussed above with reference to FIG. 4, in accordance with a second exemplary embodiment of the present invention.

FIG. 6 is a schematic cross-sectional view of a GaAs-based PNP bipolar transistor of the type discussed above with reference to FIG. 4, in accordance with a second exemplary embodiment of the present invention. The transistor 600 includes a layer 604 including the P+ emitter 620 and the P+ collector 630, which are separated by and surrounded by an insulating material such as a silicon nitride material (SiNx). In this exemplary embodiment, the layer 604 is approximately 800-1000 Å thick, and the P+ elements 620 and 630 are formed from a GaAs base that is doped with carbon to a concentration of approximately 2E19-4E19. Underlying the layer 604 is the layer 606, which includes the N– base 640 (referred to as the C-Mesa) and the base structure connections 650 and 660. In this exemplary embodiment, the layer 606 is approximately 5000-8000 Å thick, and the base 640 is formed from a GaAs base that is doped with silicon to a concentration between approximately 1E17-1E18. The base structure connections 650 and 660 are metal structures (referred to as the C-Metal), e.g., formed from gold, germanium, nickel, or titanium. The base structure connections 650 and 660 extend above the layer 606 by approximately 500 Å and are electrically insulated from the emitter 620 and collector 630. Underlying the layer 606 is the layer 608, which in this exemplary embodiment is an N+ material approximately 5000 Å thick and formed from a GaAs base that is doped with silicon to a concentration between approximately 1E18-1E19. Underlying the layer 608 is the substrate layer 610, which in this exemplary embodiment is approximately 100 µm thick and is formed from a GaAs based that is close to intrinsic (e.g., doped to a concentration of approximately 1E12). A plating metal (e.g., gold) layer 612 may underlie the substrate layer 610. Metal connectors 602 and 603 (referred to as the B-Metal) are formed on the emitter 620 and the collector 630, respectively, for the electrical connections to those elements, e.g., formed from gold, platinum, or titanium. In the exemplary embodiment shown in FIG. 6, the spacing between metal connectors 602 and 603 and similarly the spacing between the emitter 620 and the collector 630 (referred to in the drawing as dimension "Dcg_ag") are in the range of approximately 1 µm to 5 µm, for instance, around 1.5 µm; the width of emitter 620 (referred to in the drawing as dimension "Dxb") is in the range of approximately 2 µm to 12 µm, for instance, around 2.5 µm; the width of collector 630 (referred to in the drawing as dimension "Dag") is in the range of approximately 2 µm to 12 µm, for instance, around 2.5 µm; and the collector 630 is separated from the base structure connection 650 by insulating material having a width (referred to in the drawing as dimension "Doxa") in the range of approximately 1 µm to 5 µm, for instance, around 1.5 µm. Similarly, the emitter 620 is separated from the base structure connection 660 by insulating material having a width in the range of approximately 1 µm to 5 µm, for instance, around 1.5 µm. Alternative embodiments may utilize different dimensions.

Figure 7A:
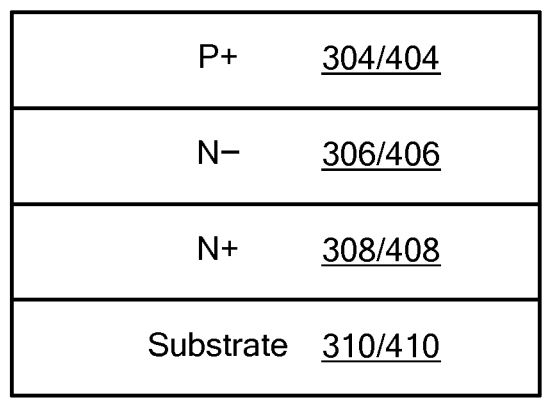
FIGS. 7A-7F are schematic and conceptual diagrams showing relevant fabrication process steps for fabricating GaAs-based lateral PNP bipolar transistors of the types described with reference to FIGS. 5 and 6, in accordance with one exemplary embodiment.
Figure 7B:
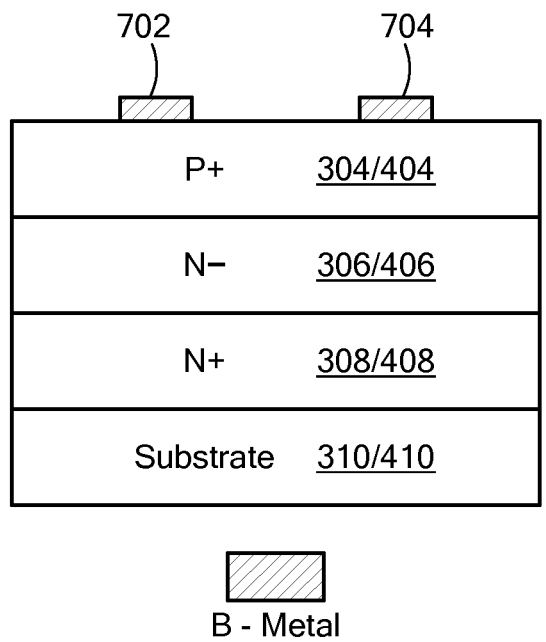
Figure 7C:
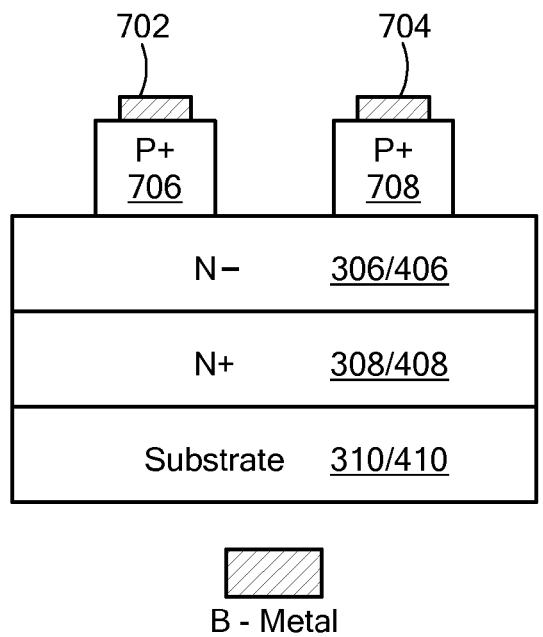
Figure 7D:
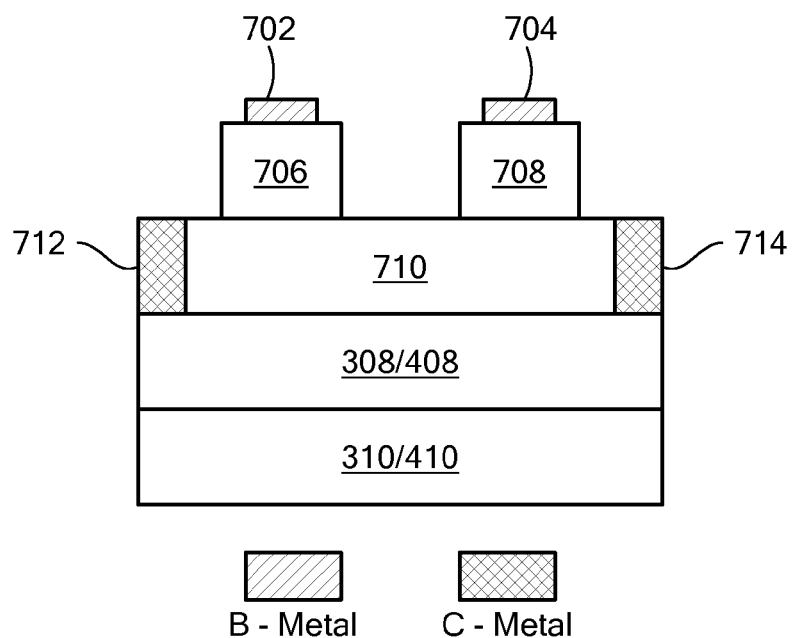
Figure 7E:
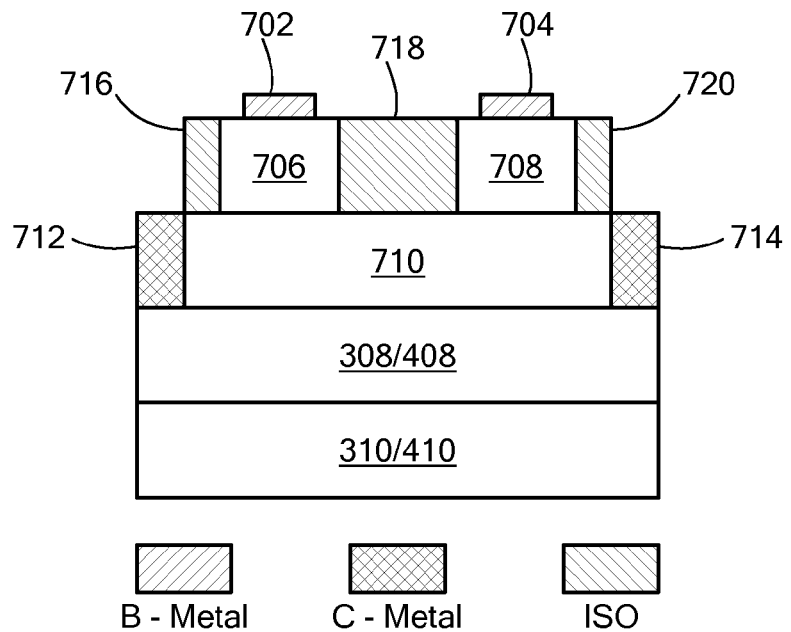
Figure 7F:
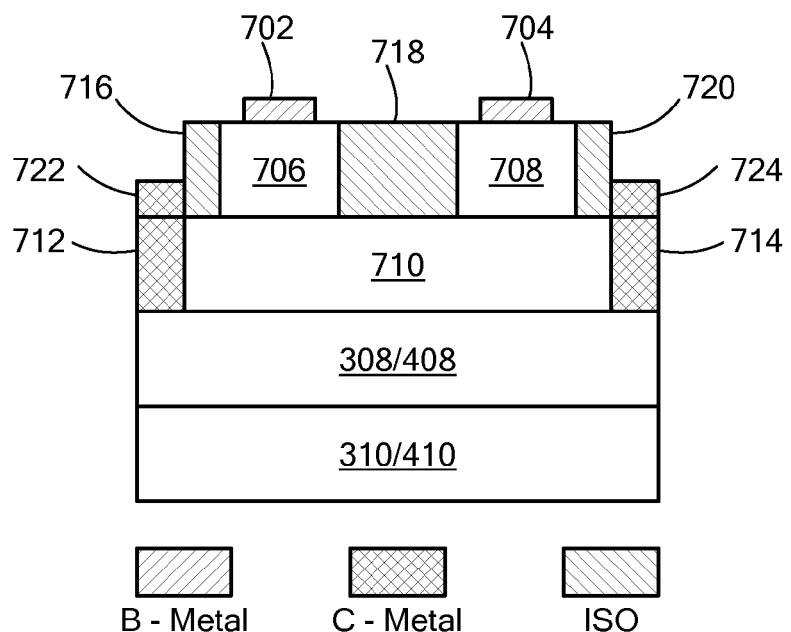

FIGS. 7A-7F are schematic and conceptual diagrams showing relevant fabrication process steps for fabricating GaAs-based lateral PNP bipolar transistors of the types described with reference to FIGS. 5 and 6, in accordance with one exemplary embodiment. FIG. 7A schematically shows the generic layer structure from which the PNP bipolar transistors are fabricated, including a substrate layer 310/410, an N+ material layer 308/408, an N– material layer 306/406, and a P+ material layer 304/404. In FIG. 7B, B-metal electrodes 702 and 704 are formed for the emitter and collector, respectively, on the P+ material layer 304/404. In FIG. 7C, the P+ material layer 304/404 is patterned to define the emitter 706 and collector 708, respectively. In FIG. 7D, the N-material layer 306/406 is patterned to define the base 710, and C-metal electrodes 712 and 714 are formed for the base. In FIG. 7E, an electrically-insulating (ISO) material is formed around and between the emitter 706 and collector 708, forming regions 716, 718, and 720. In FIG. 7F, the C-metal electrodes 712 and 714 are extended by extensions 722 and 724, respectively, with insulating region 716 separating the emitter 706 from the base structure connection 712/722 and the insulating region 720 separating the collector 708 from the base structure connection 714/724.

Figure 8:
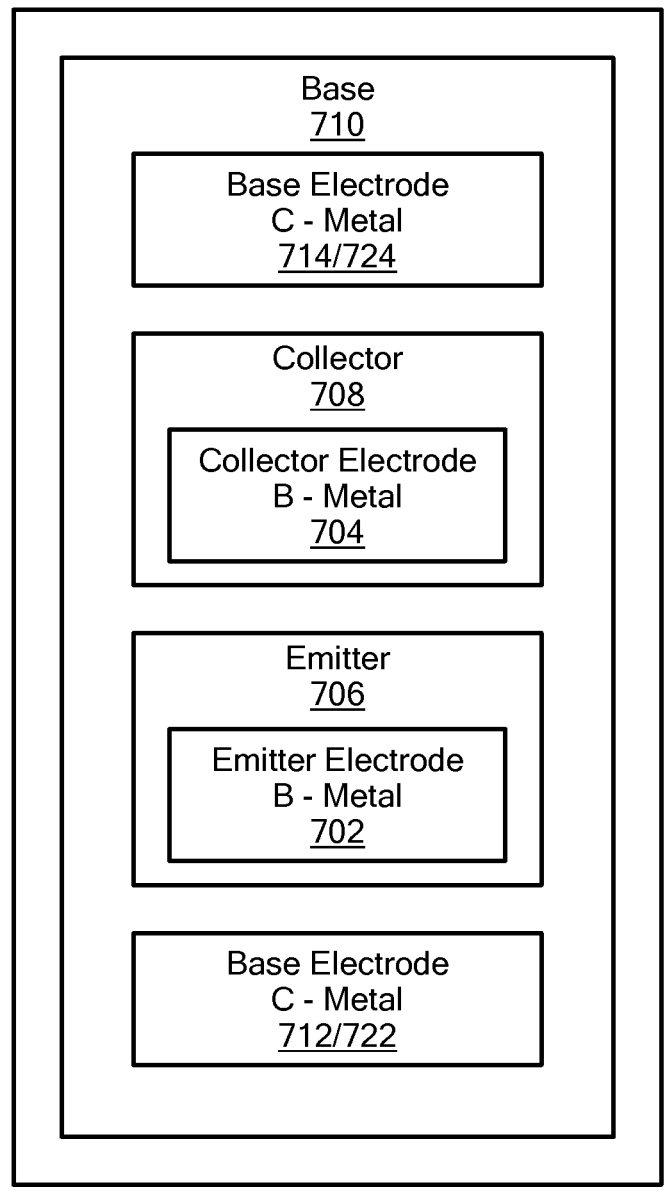
FIG. 8 is a schematic diagram showing a top view of GaAs-based lateral PNP bipolar transistor of the type shown in FIG. 6, fabricated in accordance with the fabrication process described in FIGS. 7A-7F, in accordance with one exemplary embodiment.

FIG. 8 is a schematic diagram showing a top view of GaAs-based lateral PNP bipolar transistor of the type shown in FIG. 6, fabricated in accordance with the fabrication process described in FIGS. 7A-7F, in accordance with one exemplary embodiment. Shown here is the base 710 with base (C-metal) electrodes 712/722 and 714/724. The emitter 706 and collector 708 are formed on the base 710. Electrodes (B-metal) 702 and 704 are formed on the emitter 706 and collector 708, respectively.

It should be noted that fabrication processes described above is exemplary only. For any particular implementation, fewer, additional, or different steps or processes may be utilized. For convenience, certain processing steps may have been omitted, such as, for example, details for forming a material layer or details for patterning and etching a particular material layer, which may involve, for example, depositing a protective material layer over the material to be etched, patterning the protective layer to expose a portion of the material layer to be etched, and then apply an etchant material to the exposed portion of the material layer. In some cases, materials different than those described may be suitable for a particular step or process. It would be virtually impossible to describe every combination and permutation of materials and processes that could be employed in various embodiments of the invention. Therefore, the present invention is intended to include all such materials and processes including suitable variations of the materials and processes described.

It should be noted that the dimensions shown in FIGS. 5 and 6 are exemplary and may be different in various alternative embodiments. Also, it should be noted that persons of ordinary skill in the art will recognize that different materials and/or concentrations may be used in various alternative embodiments while adhering to produce compound semiconductor lateral PNP bipolar transistors of the type described herein, and all such variations are intended to fall within the scope of the presently claimed invention.

The present invention may be embodied in other specific forms without departing from the true scope of the invention, and numerous variations and modifications will be apparent to those skilled in the art based on the teachings herein. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A compound semiconductor lateral PNP bipolar transistor comprising:
    a doped P-type planar compound semiconductor layer including a compound semiconductor-based emitter and a compound semiconductor-based collector arranged at the same level and laterally with respect to one another, wherein the emitter and the collector are separate and electrically insulated from one another;
    a doped N-type planar compound semiconductor layer underlying the doped P-type planar compound semiconductor layer and including a compound semiconductor-based base element electrically coupled to the separate emitter and collector;
    a plurality of metallic base structure connections electrically coupled to the base element and electrically insulated from the emitter and the collector;
    first and second metallic electrodes at a first level above the doped P-type planar compound semiconductor layer and electrically connected independently to the emitter and collector, respectively; and
    a plurality of base electrodes formed at a second level above the doped N-type planar compound semiconductor layer, each base electrode connected to a respective metallic base structure connection, wherein the second level is below the first level.

2. A compound semiconductor bipolar transistor according with claim 1, wherein the compound semiconductor layers are GaAs-based compound semiconductor layers.

3. A compound semiconductor transistor according to claim 1, wherein the emitter and the collector are between the plurality of metallic base structure connections.

4. A compound semiconductor transistor according to claim 2, wherein the emitter and the collector are formed from GaAs doped with carbon to a concentration between 2E19-4E19.

5. A compound semiconductor transistor according to claim 2, wherein the base element is formed from GaAs doped with silicon to a concentration between 1E18-1E19.

6. A compound semiconductor transistor according to claim 1, wherein at least one of:
    the first and second metallic electrodes are separated laterally from one another by a distance of 1 μm to 5 μm;
    the emitter and the collector are separated laterally from one another by a distance of 1 μm to 5 μm;
    the emitter has a width of 2 μm to 12 μm;
    the collector has a width of 2 μm to 12 μm; or
    each base electrode is separated laterally from an adjacent emitter or collector by a distance of 1 μm to 5 μm.

7. A compound semiconductor lateral PNP bipolar transistor comprising:
    a doped P-type compound semiconductor emitter and a doped P-type compound semiconductor collector arranged laterally with respect to one another and electrically insulated from one another;
    a doped N-type compound semiconductor base element underlying and electrically coupled to the separate emitter and collector; and
    a plurality of metallic base structure connections electrically coupled to the base element and electrically insulated from the emitter and the collector.

8. A compound semiconductor bipolar transistor according with claim 7, wherein the compound semiconductors are GaAs-based compound semiconductors.

9. A compound semiconductor transistor according to claim 7, wherein the emitter and the collector are between the plurality of metallic base structure connections.

10. A compound semiconductor transistor according to claim 8, wherein the emitter and the collector are formed from GaAs doped with carbon to a concentration between 2E19-4E19.

11. A compound semiconductor transistor according to claim 8, wherein the base element is formed from GaAs doped with silicon to a concentration between approximately 1E18-1E19.

12. A method for fabricating a compound semiconductor lateral PNP bipolar transistor, the method comprising:
    fabricating a doped P-type compound semiconductor-based emitter and a doped P-type compound semiconductor-based collector arranged laterally with respect to one another and electrically insulated from one another;
    fabricating a doped N-type compound semiconductor-based base element underlying and electrically coupled to the separate emitter and collector;
    fabricating a plurality of metallic base structure connections electrically coupled to the base element and electrically insulated from the emitter and the collector;
    fabricating first and second metallic electrodes at a first level above the emitter and collector layer and electrically connected independently to the emitter and collector, respectively; and
    fabricating a plurality of base electrodes at least one base electrode at a second level above the base element layer, each base electrode connected to a respective metallic base structure connection, wherein the second level is below the first level.

13. A method according to claim 12, wherein the emitter and the collector are fabricated from a doped P-type planar compound semiconductor layer, and wherein the base element is fabricated from a doped N-type planar compound semiconductor layer underlying the doped P-type planar compound semiconductor layer.

14. A method according to claim 12, wherein the compound semiconductors are GaAs-based compound semiconductors.

15. A method according to claim 12, wherein the emitter and the collector are between the plurality of metallic base structure connections.

16. A method according to claim 14, wherein the emitter and the collector are formed from GaAs doped with carbon to a concentration between 2E19-4E19.

17. A method according to claim 14, wherein the base element is formed from GaAs doped with silicon to a concentration between 1E18-1E19.

18. A method according to claim 12, wherein at least one of:
- the first and second metallic electrodes are separated laterally from one another by a distance of 1 μm to 5 μm;
- the emitter and the collector are separated laterally from one another by a distance of approximately 1 μm to 5 μm;
- the emitter has a width of 2 μm to 12 μm;
- the collector has a width of 2 μm to 12 μm; or each base electrode is separated laterally from an adjacent emitter or collector by a distance of 1 μm to 5 μm.

* * * * *

UNITED STATES PATENT AND TRADEMARK OFFICE
CERTIFICATE OF CORRECTION

PATENT NO. : 8,878,344 B2  Page 1 of 1
APPLICATION NO. : 13/655026
DATED : November 4, 2014
INVENTOR(S) : Parthasarathy et al.

It is certified that error appears in the above-identified patent and that said Letters Patent is hereby corrected as shown below:

In the Claims

Col. 8, line 36, Claim 11
delete "approximately"

Col. 8, lines 54-55, Claim 12
delete "at least one base electrode"

Signed and Sealed this
Second Day of June, 2015

Michelle K. Lee
*Director of the United States Patent and Trademark Office*

UNITED STATES PATENT AND TRADEMARK OFFICE
CERTIFICATE OF CORRECTION

PATENT NO. : 8,878,344 B2  
APPLICATION NO. : 13/655026  
DATED : November 4, 2014  
INVENTOR(S) : Srivatsan Parthasarathy et al.

Page 1 of 1

It is certified that error appears in the above-identified patent and that said Letters Patent is hereby corrected as shown below:

In the Specification

In Col. 4, line 22
replace "N+"
with "N-"

In Col. 4, line 23
replace "N-"
with "N+"

In Col. 4, line 53
replace "N+"
with "N-"

In Col. 4, line 54
replace "N-"
with "N+"

In Col. 6, line 38
replace "N-material"
with "N- material"

Signed and Sealed this
Twenty-ninth Day of November, 2016

Michelle K. Lee
*Director of the United States Patent and Trademark Office*